United States Patent [19]
Korsunsky et al.

[11] Patent Number: 4,873,761
[45] Date of Patent: Oct. 17, 1989

[54] INSERTION/EXTRACTION TOOL

[75] Inventors: Iosif Korsunsky, Harrisburg; Gerald L. Foreman; Steven P. Bateman, both of Hummelstown, all of Pa.

[73] Assignee: AMP Incorporated, Harrisburg, Pa.

[21] Appl. No.: 238,636

[22] Filed: Aug. 30, 1988

[51] Int. Cl.⁴ .................................... H05K 13/04
[52] U.S. Cl. ................................ 29/741; 29/268; 29/747; 29/764
[58] Field of Search ............... 29/741, 764, 758, 268, 29/747

[56]  References Cited
U.S. PATENT DOCUMENTS 3,538,580 11/1970 Bruner .
3,896,533  7/1975 Ullman .................................. 29/203
4,615,110 10/1986 Crone .................................... 29/741
4,679,319  7/1987 Grabbe ................................... 29/843

OTHER PUBLICATIONS

AMP Instruction Sheet IS-7510 released 04-27-71.
AMP Instruction Sheet IS-6956 released 09-30-86.

Primary Examiner—Carl E. Hall
Attorney, Agent, or Firm—Bruce J. Wolstoncroft

[57]  ABSTRACT

A tool (20) cooperates with a chip carrier socket (10) to insert and/or remove a chip carrier (2) therefrom. In operation, the tool (20) is positioned in alignment with the socket (10), the chip carrier (2), and a cover (32). The tool (20) is actuated, causing the engagement means (56, 58) to pivot about the pins (102). This pivoting action causes shoulders (94) to engage a respective surface of the chip carrier socket (10) or the chip carrier (2). Movable frame means (59) are provided on the tool (20). The movable frame means (59) being movable from a first position to a second position, such that when the frame means (59) is provided in the first position, the shoulders (94) engage the chip carrier socket (10) to insert the chip carrier (2) therein. When the movable frame means (59) is in the second position, the shoulders (94) engage the chip carrier (2) to extract the chip carrier (2) from the chip carrier socket (10).

12 Claims, 5 Drawing Sheets

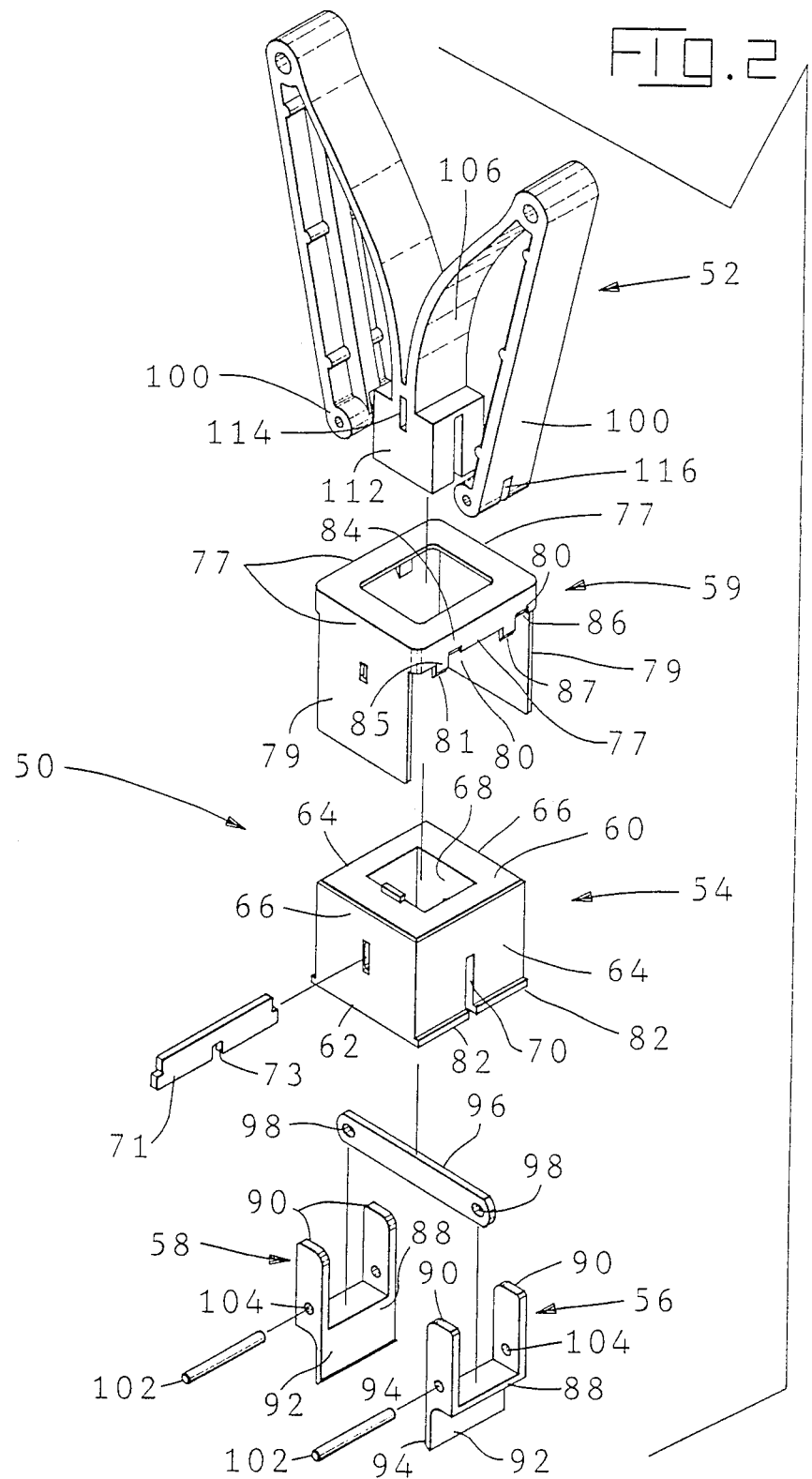

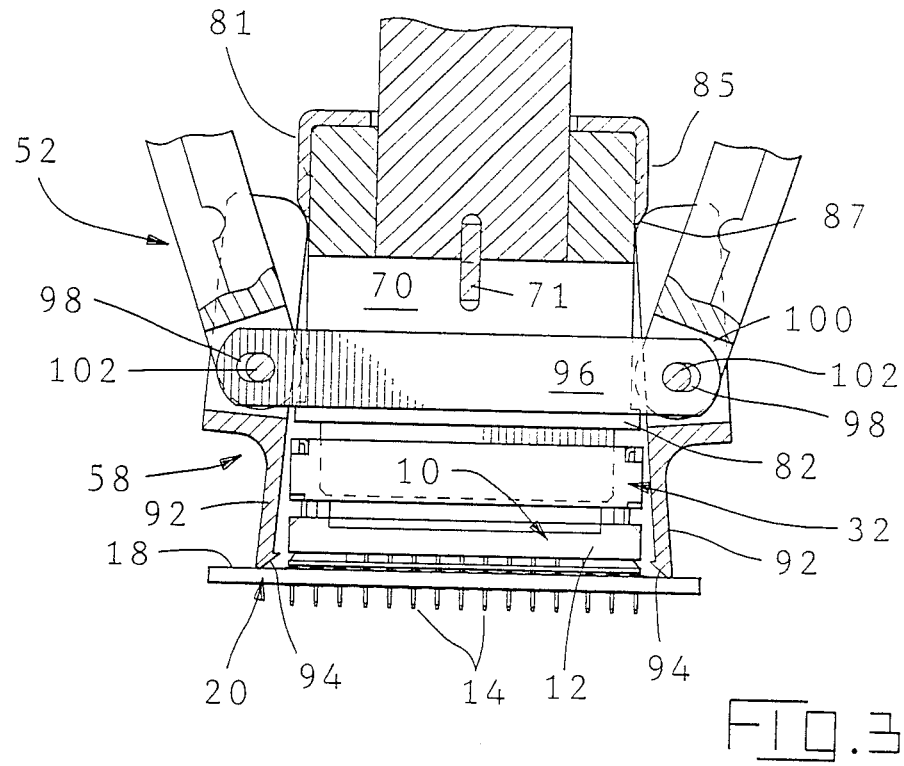
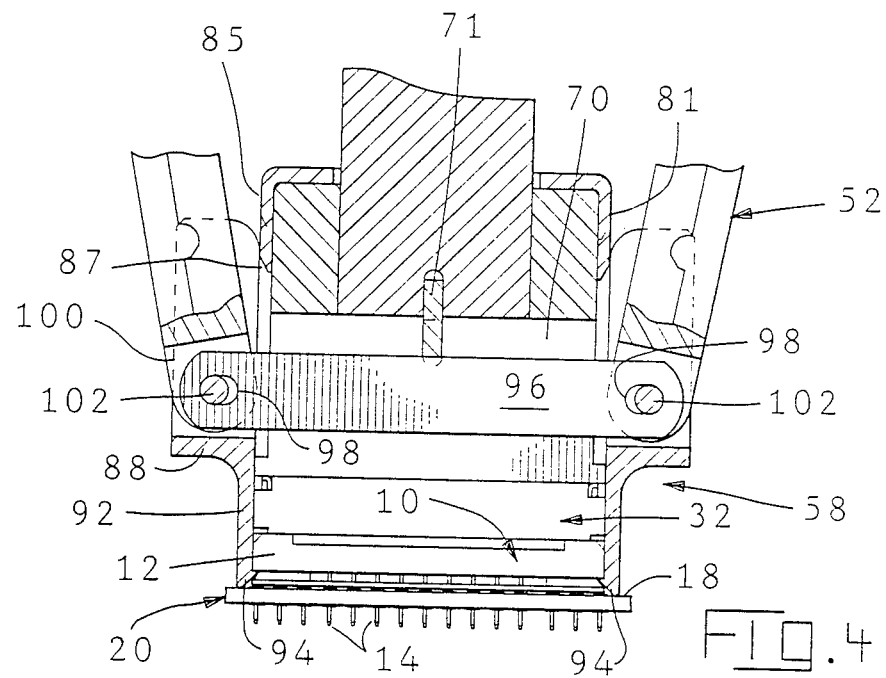

INSERTION/EXTRACTION TOOL

RELATIONSHIP TO COPENDING APPLICATIONS

This application is a continuation-in-part application of U.S. patent application Ser. No. 216,935, filed July 8, 1988, now U.S. Pat. No. 4,827,607.

FIELD OF THE INVENTION

The invention relates to a tool which is used to insert and/or extract chip carriers from chip carrier sockets. In particular, the invention is directed to a tool which has movable frame means provided thereon, such that when the movable frame means is engaged, the operation of the tool is altered between insertion and extraction functions.

BACKGROUND OF THE INVENTION

Integrated circuits are commonly mounted in chip carriers which are bodies of insulating material having side surfaces to which conductors from the integrated circuit extend. Traditionally, terminal pads are provided on the side surfaces of the chip carrier body and contact is made with these pads to electrically connect the integrated circuit to conductors on a substrate, such as a ceramic substrate or a circuit board. Electrical connection is usually established with the terminal pads on the chip carrier by means of a chip carrier socket which comprises a socket body having a recess which receives the chip carrier and contact terminal in surrounding relationship to the recess so that when the chip carrier is placed in the recess, the contact terminals electrically engage the terminal pads of the chip carrier.

Notwithstanding the relatively small size of the chip carrier socket and the contact terminals in the socket, it is necessary that each terminal be capable of exerting contact force on a terminal pad in a chip carrier in order to establish good electrical connection between the contact terminal and the terminal pad on the chip carrier, particularly if the terminal pad is tin plated rather than gold plated. It should also be noted that chip carriers and chip carrier sockets are subject to the dimensional variations which all mass produced parts are subjected to. These dimensional variations result from manufacturing tolerances. However, even with dimensional variation, the design and performance requirements of the chip carrier assembly must be satisfied even in "worst case" conditions.

In order to insure that the terminals exert the appropriate force on the terminal pads, it is beneficial to have an insertion tool which is reliable and easy to use, and which supplies the force required to insure that an electrical connection is effected. The insertion tool must be configured to distribute the insertion force evenly over the surface of the chip carrier, in order to insure that a reliable electrical connection is provided between each contact terminal and respective terminal pad.

It is also useful to have an extraction tool which can be used to remove the chip carrier from the chip carrier socket. The extraction tool must be configured to permit the removal of the chip carrier without damaging the contact terminals or the terminal pads, thereby allowing the chip carrier and/or the chip carrier socket to be used again.

The need for an insertion tool and an extraction tool can be a significant cost to the users of the chip carrier and chip carrier sockets. Therefore, it would be beneficial to provide a tool which is easy to use, inexpensive to manufacture, and is capable of inserting the chip carrier into the chip carrier socket, as well as removing the chip carrier from the chip carrier socket.

SUMMARY OF THE INVENTION

The invention is directed to an insertion and/or extraction tool which is easy to use, inexpensive to manufacture, and insures that a positive electrical connection will be effected. The configuration of the tool allows for the easy conversion of the tool from and insertion tool to an extraction tool.

According to the invention, a tool for manipulating a chip carrier socket assembly having a chip carrier and a chip carrier socket is described. The tool has handle means which are provided so that the operator can activate the tool.

Engagement means are provided proximate the chip carrier and the chip carrier socket when the tool is positioned in alignment with the socket assembly. The engagement means is movable, thereby allowing the engagement means to cooperate with the chip carrier socket assembly.

Movable frame means are provided adjacent the engagement means. The movable frame means are movable between a first position and a second position. A first means, provided on the frame means, cooperates with the engagement means when the frame means is provided in the first position, such that as the handle means are operated, the tool inserts the chip carrier in the chip carrier socket. A second means, provided on the frame means, cooperates with the engagement means when the frame means is provided in the second position, such that as the handle means are operated, the tool extracts the chip carrier from the chip carrier socket.

BRIEF DESCRIPTION OF THE DRAWINGS

FIG. 2 is an exploded perspective view of the hand tool, showing the various components of the hand tool.

FIG. 3 is a partial view of the hand tool positioned in alignment with the chip carrier and the chip carrier socket, the hand tool is shown in an open insertion position.

FIG. 4 is a partial view similar to that shown in FIG. 3, the hand tool is shown in a closed position, with the chip carrier fully inserted into the chip carrier socket.

DETAILED DESCRIPTION OF THE INVENTION

Figure 1:
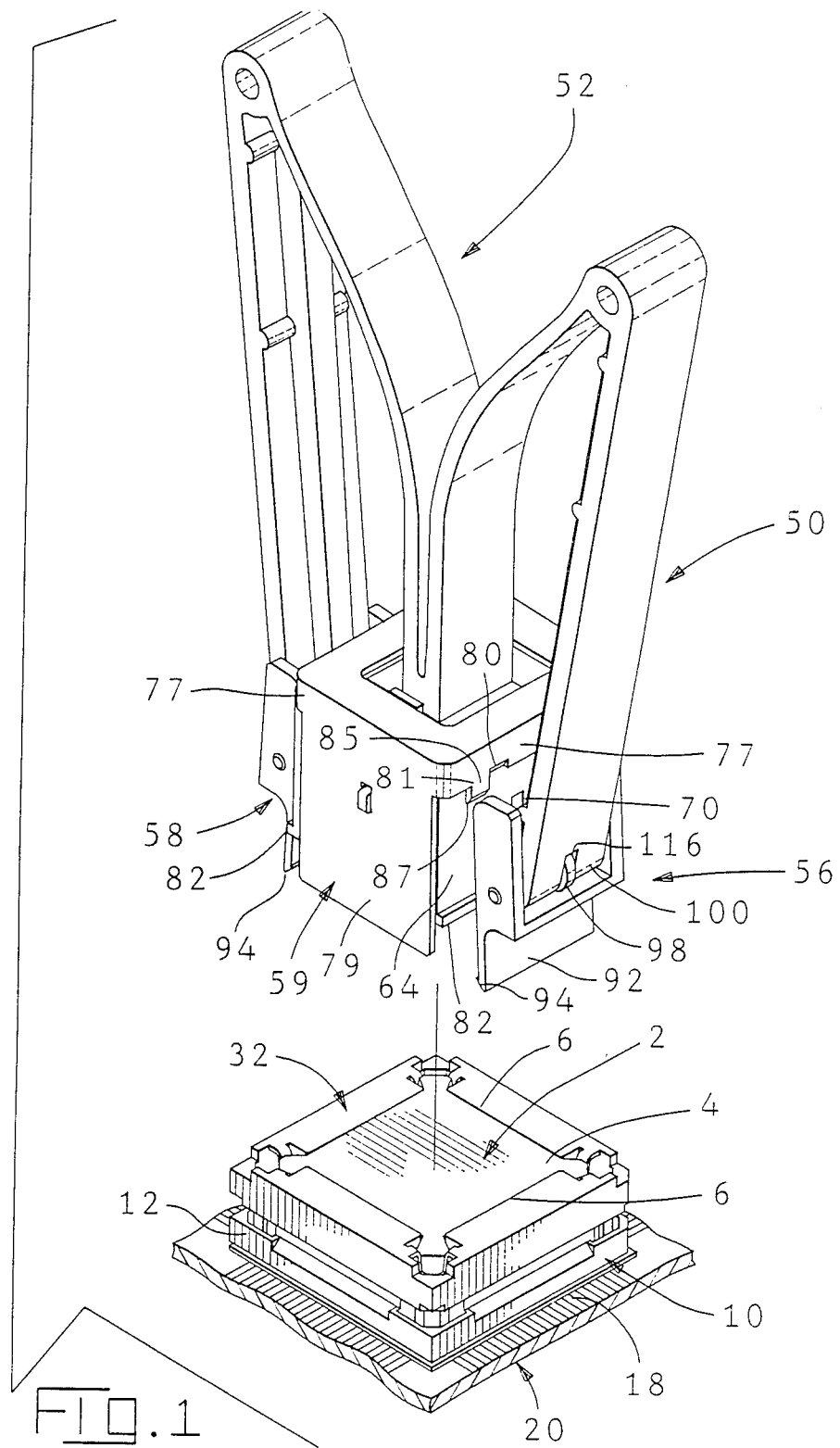
FIG. 1 is a perspective view of a hand tool according to the invention, the hand tool is provided in alignment with a chip carrier and a chip carrier socket.

Referring to FIGS. 1 and 3, a typical integrated circuit (IC) chip carrier 2 comprises a flat square body of insulating material having oppositely-facing major surfaces 4 and outwardly directed side surfaces 6 on which there are provided spaced-apart contact zones or leads. These contact zones are connected by conductors embedded in the insulating body to an integrated circuit chip which is also embedded in the insulating body.

In order to connect the contact zones on the IC chip carrier to conductors on a substrate such as a circuit board, a chip carrier socket assembly 10 is provided. The socket assembly 10 compises a socket housing 12 containing terminals 14 which are electrically connected to terminal pads on an upper surface 18 of the substrate 20. Each terminal 14 is a flat stamped member having the conductive and resilient characteristics required.

A chip carrier cover 32 is provided to cooperate with chip carrier 2, to insure that chip carrier 2 will be undamaged during the transportation thereof. The cover also cooperates with the contact zones of the chip carrier 2 and with the terminals 14 to provide the electrical stability required for operation.

The housing, terminals, and cover are more fully described in U.S. application Ser. No. 7/116,770 filed Nov. 3, 1987 which is hereby incorporated by reference in its entirety.

Referring now to FIGS. 3 through 6, a tool 50, in accordance with the invention, is configured to be used with chip carrier socket assembly 10 or the like. The tool 50 is used for the insertion and the removal of the chip carrier 2 and cover 32 into and out of the socket assembly 10.

As best shown in FIG. 2, tool 50 compises a handle means 52, a support block 54, engagement means 56, 58, and a movable frame 59. As is best shown in FIG. 2, support block 54 has a first major surface 60, a second major surface 62, opposed side surfaces 64, and opposed end surfaces 66. Support block 54 is made of a plastic material, or any other material which has the strength characteristics required.

An opening 68 is provided in the first major surface 60 of support block 54. The opening extends from first major surface 60 in a direction toward second major surface 62. The opening 68 is provided to cooperate with a portion of the handle 52, as will be discussed. A recess 70 is provided in the second major surface 62 of block 54, the recess 70 extends from the second major surface 62 toward the first major surface 60.

Figure 7:
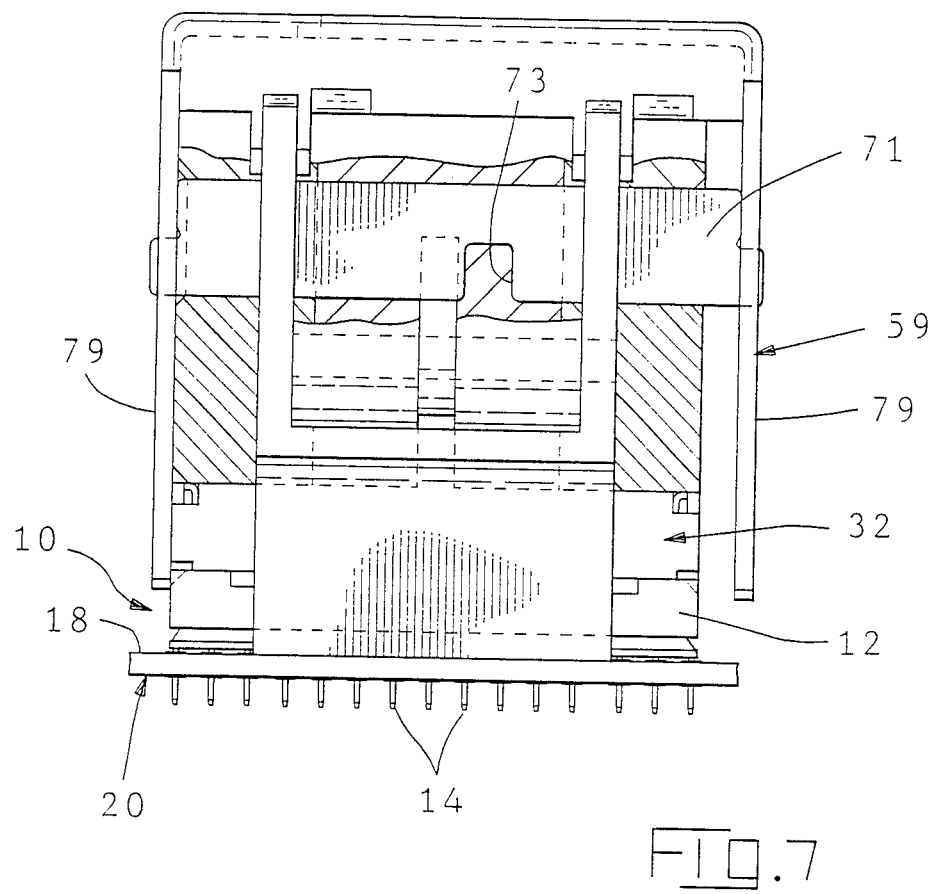
FIG. 7 is a cross-sectional view of the hand tool, showing the positioning of movable frame means when the frame means of the hand tool is in the insertion position.

As is best shown in FIG. 7, a movable bar 71 is provided in a channel 72 which extends through block 54. Bar 71 intersects recess 70, such that the longitudinal axis of bar 71 is essentially perpendicular to the longitudinal axis of recess 70. A slot 73 is provided proximate the center of bar 71, the slot having essentially the same width as recess 70. The slot extends from a bottom surface of bar 71 toward a top surface thereof.

Provided on end surfaces 66 proximate second major surface 62 are projections 82. In the embodiment shown in Figure, two projections 82 are provided on each end surface 66. However, other configurations of projections are possible.

Movable frame 59 is positioned adjacent support block 54. Frame has support members 77 provided proximate first major surface 60. The support members form a rectangular configuration which encompasses side surfaces 64 and end surfaces 66. Extending from respective positions of support members, which are proximate side surfaces 64, are bar engagement members 79. Bar engagement members 79 extend from support members 77 toward second major surface 62. Portions of the bar engagement members are integrally attached to ends of bar 71. Consequently, as will be more fully discussed, as frame 59 is moved bar 71 is moved accordingly.

Provided on support members 77 of frame 59, adjacent end surface 66 are first camming means 80. As shown in FIGS. 1 and 2, each first camming means 80 has a flat surface 84 which is essentially parallel to a respective end surface 66. Extending from each flat surface 84 in a direction toward the respective end surface 66 and toward the second major surface 62 is a sloping surface 86. The angle of the sloping surface can vary according to the characteristics required.

Second camming means 81 are provided on support member 77 proximate first camming means 80. Second camming means 81 extend from first camming means 80 toward the second major surface 62. Each second camming means 81 has a flat surface 85 which is essentially parallel to a respective end surface 66. Extending from each flat surface 85 in a direction toward the respective end surface 66 and toward the second major surface 62 is a sloping surface 87. The angle of the sloping surface can vary according to the characteristcs required.

Positioned proximate frame 59 and and surfaces 66 of support block are engagement means 56, 58. Engagement means 56, 58 are comprised of base portions 88 and arm portions 90. As is shown in FIG. 1 and 2, arm portions 90 are positioned at either end of base portions 88, and extend in a direction which is essentially perpendicular to the base portions. As will be more fully discussed below, arm portions 90 cooperate with camming means 80, 81 and base portions 88 cooperate with projections 82.

Plates 92 extend from base portions 88 in a plane which is essentially parallel to the plane of arm portions 90. However, plates 92 extend from base portions 88 in the opposite direction as arm portions 90. Provided at the free ends of plates 92 are engagement shoulders 94, the shoulders are provided to engage the chip carrier socket assembly, as will be discussed.

A resilient spring member 96 is provided and cooperates with engagement means 56, 58 and support block 54. The spring member 96 is positioned in recess 70 of support block 54. Member 96 has openings 98 provided proximate the ends thereof. Spring member 96 cooperates with engagement means 56, 58 to insure that the engagement means will be maintained in a position which is proximate end surfaces 66 of support block 54. It should be noted that resilient spring member 96 may be replaced with a non-resilient bar member, without departing from the scope of the invention.

Handle 52 is manufactured from plastic or any other material having the characteristics desired for operation. Handles 52 have ends 100 which are attached to pins 102. Pins 102 extend through openings 104 of arm portions 90. The cooperation of ends 100 with pins 102 allows for ends 100 to be pivoted about pins 102. As is best shown in FIG. 1, pins 102 secure respective engagement means 56, 58 with spring member 96 and handle 52. As is shown in FIGS. 3 through 6, openings 98 of spring member 96 are dimensioned slightly larger than the diameter of pins 102. The use of pins 102 allows all of the various components connected thereto to pivot with respect to each other when tool 50 is in operation.

At inner ends 106 of handles 52, an adapter block 112 is provided. Adapter block 112 is secured in opening 68 by the positioning of bar 71 in openings 114 of block 112.

As can be seen in FIGS. 1 and 2, ends 100 of handles 52 have slots 116 provided proximate the center thereof. Slots 116 cooperate with spring member 96 to insure that spring member 96 is maintained in recess 70 of support block 54.

In use, when chip carrier 2 is to be inserted into chip carrier socket assembly 10, chip carrier 2 and cover 32 are positioned over chip carrier socket assembly 10, such that the leads of chip carrier 2 are provided in alignment with terminals 14 of socket assembly 10. With the chip carrier and the cover provided in posisition, tool 50 is aligned with socket assembly 10. The proper alignment of tool 50 has engagement means 56, 58 provided proximate respective side surfaces of socket assembly 10. It should be noted that, when tool 50 is in an unstressed or open position, the spacing between plates 92 is greater than the width of socket assembly 10, thereby facilitating the placement of tool 50 over socket assembly 10. In this open position shoulders 94 of plates 92 are provided proximate substrate 20, and second major surface 62 of support block 54 is provided proximate the upper major surface of chip carrier 2.

For insertion to occur, frame 59 must be positioned in a first position. In the first position, frame 59 cooperates with bar 71 to position bar 71 so that slot 73 of bar is not provided in alignment with recess 70, as is shown in FIG. 7. Also, when the frame is in the first position, second camming means 81 are provided in alignment with the free ends of arm portions 90 of engagement means 56, 68, as is shown in FIG. 1.

With the various components 2, 10, 32 and tool 50 provided in alignment, the handles 52 of tool 50 are forced toward each other. As shown in FIGS. 3 and 4, this causes pins 102 to be moved away from second major surface 62 of support block 54 in a direction which is essentially parallel to end surfaces 66. This movement of pins 102 forces the free ends of arm portions 90 to move away from second major surface 62, causing portions 90 to slidingly engage sloping surfaces 87 of second camming means 81.

The sliding motion of the free ends of arm portions 90 along sloping surfaces 87 causes the free ends to rotate about pins 102, such that as the free ends of arm portions 90 are rotated away from respective end surfaces 66 of support block 54, the free ends of plates 92 are rotated toward the side surfaces of socket assembly 10. This rotation of plates 92 insures that shoulders 94 will be camed into engagement with the lower surface of socket assembly 10, as shown in Figure. With shoulders 94 positioned in engagement with the lower surface, handles 52 are continued to be forced together, causing the continued upward motion of pins 102 in a plane which is parallel to end surface 66. Correspondingly, as the free ends of arm portions 90 continue to move, the free ends move past sloping surfaces 87 and into engagement with flat surfaces 85. The cooperation of flat surfaces 85 and the free ends maintains the free ends in the rotated position as described. Consequently, shoulders 94 of plates 92 are maintained in engagement with the lower surface of assembly 10.

As handles 52 are forced together, support block 54 is moved downward, toward circuit board 20. This downward movement causes second major surface 62 of support block 54 to engage the upper surfaces of cover 32 and chip carrier 2, thereby forcing the combination downward into engagement with assembly 10. This downward motion of block 54 is continued until the leads of chip carrier 2 are secured in electrical engagement with terminals 14 of assembly 10.

It should be noted that the force needed to insert leads 8 and cover 32 in terminals 14 is greatest just prior to when the leads and cover are secured in the terminals. This is due to the resilient nature of the terminals 14. It is therefore essential that shoulders 94 be maintained in engagement with the lower surface of assembly 10 when the peak forces are obtained. In order to insure that the cooperation between shoulders 94 and the lower surface of assembly 10 will not fail, spring member 96 supplies an increased force which draws plates 92 and shoulders 94 toward each other at the time when the peak force must be overcome.

This increased force is provided by the cooperation of bar 71 with spring member 96. As pins 102 are forced upward, spring member 96, which is attached to pins 102, is forced further into recess 70. As this occurs a center portion of spring member 96 engages bar 71. Consequently, the continued upward motion of spring member 96 into recess 70 causes spring member 96 to bow or bend about bar 71. This bowing action results in the ends of spring member 96 being forced inward toward end surfaces 66 of support block 54. As engagement means 56, 58 are attached to the ends of members 96, the inward motion of members 96 causes plates 92 and shoulders 94 to move inward, toward the side surfaces of assembly 10. This movement insures that shoulders 94 will not disengage from the lower surface of assembly 10, no matter the force involved.

However, in certain instances, it is not required for the spring member 92 to be provided. Rather the non-resilient bar is provided due to the resilient characteristics required for operation.

The cooperation of spring member 96 and bar 71 also acts as a stop member. In other words, second major surface 62 of support block 54 can only be moved toward the chip carrier socket a fixed distance, before spring member 96 engages bar 71 to limit any further downward motion. This insures that the insertion force exerted by the tool onto the chip carrier will not be large enough to cause the failure of the chip carrier and the chip carrier socket.

It is also important to note, that the operation of tool 50 insures that the insertion forces will be distributed evenly over the surface of cover 32 and chip carrier 2. This even distribution of forces is due to the uniform movement of second major surface 62 of support block 54 with respect to assembly 10. The even distribution of insertion force results in a positive electrical connection being effected between each lead and each respective terminal, particularly when the leads and the terminals are closely spaced.

When chip carrier 2 is to be extracted from chip carrier socket assembly 10, tool 50 is placed in alignment with socket assembly 10. As was described previously, the proper alignment of tool 50 has engagement means 56, 58 provided proximate respective side surfaces of socket assembly 10. It should be noted that, when tool 50 is in an unstressed or open position, the spacing between plates 92 is greater than the width of socket assembly 10, thereby facilitating the placement of tool 50 over socket assembly 10. In this open position shoulders 94 of plates 92 are provided proximate substrate 20, and second major surface 62 of support block 54 is provided proximate upper major surface of chip carrier 2.

For extraction to occur, frame 59 must be positioned in a second position. In the second position, frame 59 cooperates with bar 71 to position bar 71 so that slot 73 of the bar is provided in alignment with recess 70. Also, when the frame is in the second position, first camming means 80 are provided in alignment with the free ends of arm portions 90 of engagement means 56, 58.

Figure 5:
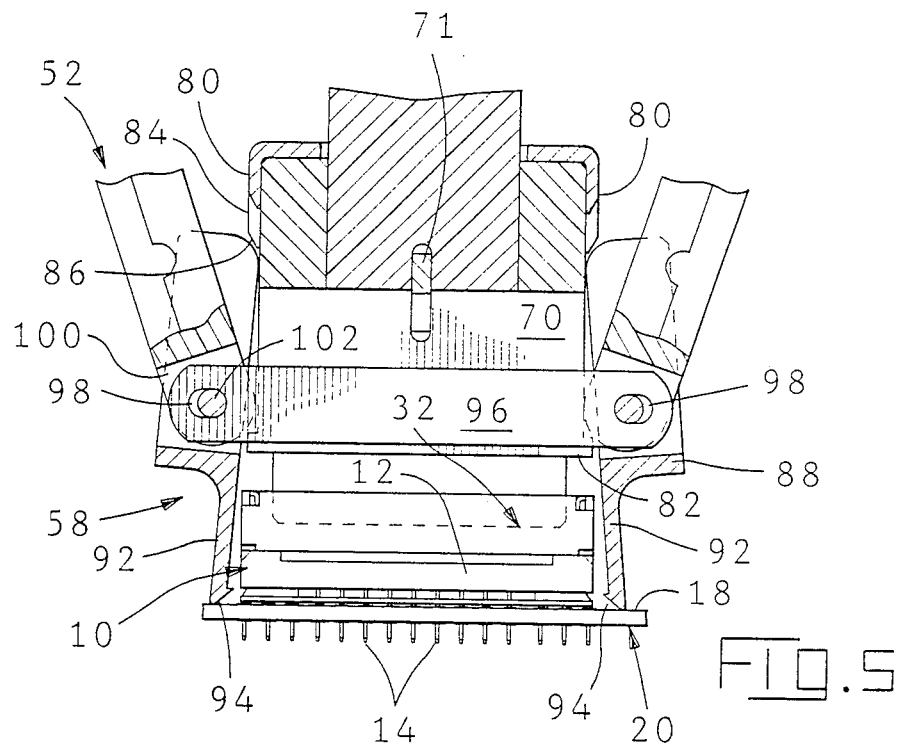
FIG. 5 is a partial view of the hand tool positioned in alignment with the chip carrier and the chip carrier socket, the hand tool is shown in a open extraction position.
Figure 6:
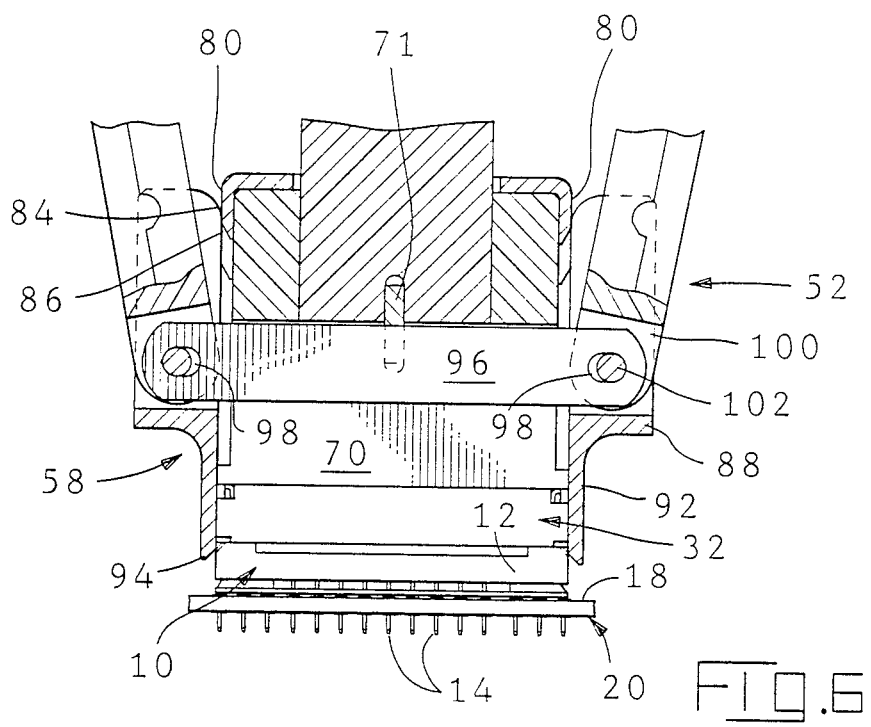
FIG. 6 is a partial view similar to that shown in FIG. 5, the hand tool is shown in a closed position just prior to the chip carrier being removed from the chip carrier socket.

With tool 50 provided in alignment with assembly 10, handles 52 of tool 50 are forced toward each other. As shown in FIGS. 5 and 6, this causes pins 102 to be moved away from second major surfaces 62 of support block 54, in a direction which is essentially parallel to end surfaces 66. This movement of pins 102 forces the free ends of arm portions 90 to move away from second major surface 62. This parallel type motion is continued until the free ends of arm portions engage sloping surfaces 86 of first camming means 80. It should be noted that the sloping surfaces of the first camming means are spaced further from the second major surface 62 than are the sloping surfaces of the second camming means. Therefore, during the extraction process, the free ends of arm portions 90 are moved further away from the second major surface 62 of the support block 54 before they are forced to rotate, as will be discussed.

The sliding motion of the free ends of arm portions 90 along sloping surfaces 86 causes the free ends to rotate about pins 102, such that as the free ends of arm portions 90 are rotated away from respective end surfaces 66 of support block 54, the free ends of plates 92 are rotated toward the side surfaces of socket assembly 10. However, as this rotation is delayed, due to the travel of the free ends in a direction parallel to the end surfaces 66 prior to engagement with the sloping surfaces, the shoulders 94 will be cammed into engagement with the lower surface of the chip carrier cover, as shown in Figure. With shoulders 94 positioned in engagement with the lower surface, handles 52 are continued to be forced together, causing the continued upward motion of pins 102 in a plane which is parallel to side surfaces 64. Correspondingly, as the free ends of arm portions 90 continue to move, the free ends move past sloping surfaces 86 and into engagement with flat surfaces 84. The cooperation of flat surfaces 84 and the free ends maintains the free ends in the rotated position as described. Consequently, shoulders 94 of plates 92 are maintained in engagement with the lower surface of cover 32.

As handles 52 are forced together, plates 92 are moved upward, away from circuit board 20. The motion is continued until the chip carrier and the cover are removed from the chip carrier socket.

The cooperation of spring member 96 and bar 71 acts as a stop member, to prevent spring member 96 from being moved to far. As the handles 52 are forced together, spring member 96 is forced to move toward first major surface 60 of support block 54. This motion is continued as spring member 96 enters slot 73 of bar 71 which is provided in alignment with recess 70. The engagement of the top surface of spring member 96 with an end wall of slot 73 provides a stop means, thereby insuring that the upward motion of spring member 96 will be limited to prevent damage to tool 50. It should be noted that the the spring member is moved closer to the first major surface of the support block during the extraction process, as compared to the insertion process. This is because slot 73 is provided in alignment with recess 70 during the extraction process, thereby providing a stop surface which is nearer the first major surface 60. Consequently, the configuration of the tool allows for both the insertion and extraction of the chip carrier and cover from the chip carrier socket.

Changes in construction will occur to those skilled in the art and various apparently different modifications and embodiments may be made without departing from the scope of the invention. The matter set forth in the foregoing description and accompanying drawings is offered by way of illustration only.

We claim:

1. A tool for manipulating a chip carrier socket assembly having a chip carrier and a chip carrier socket, the tool comprising:

handle means;

engagement means for engaging the chip carrier and the chip carrier socket, the engagement means provided proximate the chip carrier and the chip carrier socket, and being movable between an open and a closed position, thereby allowing the engagement means to cooperate with the chip carrier socket assembly;

frame means which are movable relative to the handle means, the frame means provided adjacent the engagement means, the movable frame means being movable between a first position, in which the chip carrier will be inserted into the chip carrier socket, and a second position, in which the chip carrier will be extracted from the chip carrier socket;

a first camming means, provided on the frame means, the first means cooperates with the engagement means when the frame means is provided in the first position, such that as the handle means are operated, the tool inserts the chip carrier in the chip carrier socket; and a second camming means, provided on the frame means, the second means cooperates with the engagement means when the frame means is in the second position, such that as the handle means are operated, the tool extracts the chip carrier from the chip carrier socket.

2. A tool as recited in claim 1 wherein a support member is provided, the support member cooperating with the handle means and the movable frame means to maintain the handle means and the movable frame means in position relative to each other, the support member having a first major surface, a second major surface, and side surfaces extending therebetween.

3. A tool as recited in claim 2 wherein the support member has a recess which extends from the second major surface toward the first major surface, the second major surface provided to cooperate with the chip carrier as the chip carrier is moved.

4. A tool as recited in claim 3 wherein portions of the engagement means are provided on opposed sides of the support block, such that the spacing between free ends of the engagement means is greater than the width of the chip carrier socket, the engagement means are connected to the handle means by pins, such that as the handle means are moved, the engagement means is caused to move.

5. A tool as recited in claim 3 wherein a resilient member of the engagement means is provided which extends through the recess, ends of the resilient member being pivotally attached to the portions of the engagement means which are provided on opposed sides of the support block.

6. A tool as recited in claim 3 wherein the movable frame means has a first surface which has side surfaces extending therefrom, the side surface of the movable frame means are provided adjacent the sides surfaces of the support member, a bar member extends from a respective side surface of the movable frame means to an opposed side surface.

7. A tool as recited in claim 6 wherein the bar member of the movable frame means extends essentially perpendicular to the recess of the support member, the bar member extending transversely through the recess.

8. A tool as recited in claim 7 wherein the bar member has a channel provided therein, the channel extends to the first means provided proximate the first major surface, the second means is provided adjacent the channel and is proximate the second major surface, the first and second means act as stop surfaces.

9. A tool as recited in claim 8 wherein, the channel is moved between an insertion and an extraction position as the movable frame is moved between a first position and a second position, such that as the bar is moved to the insertion position, the channel is moved into alignment with the recess, allowing the resilient member to be moved toward first major surface until the resilient member engages the first means, and as the bar is moved to the extraction position, the channel is moved out of alignment with the recess, allowing the resilient member to be moved toward the first major surface until the resilient member engages the second means.

10. A tool as recited in claim 9 wherein first and second camming means are provided on the movable frame means, each camming means has a flat surface and sloping surface, the flat surface being positioned in a plane which is essentially parallel to the plane of a respective end surface of the support member, the sloping surface extending from the flat surface in a direction which is toward the respective end surface and toward the second major surface of the support member.

11. A tool as recited in claim 10 wherein the first camming means is provided adjacent the second camming means, such that as the frame means is provided in the first position, the first camming means are provided in alignment with the portions of the engagement means, thereby facilitating the insertion of the chip carrier into the chip carrier socket.

12. A tool as recited in claim 10 wherein the first camming means is provided adjacent the second camming means, such that as the frame means is provided in the second position, the second camming means are provided in alignment with the portion of the engagement means, thereby facilitating the extraction of the chip carrier from the chip carrier socket.

* * * * *